United States Patent [19]
Toth et al.

[11] Patent Number: 5,952,272
[45] Date of Patent: Sep. 14, 1999

[54] HIP METHOD OF MAKING HIGH TEMPERATURE MERCURY-CONTAINING SUPERCONDUCTORS

[75] Inventors: Louis E. Toth, Washington, D.C.; William Lechter, New Market, Md.; Earl F. Skelton, Washington, D.C.; Michael Osofsky, Burtonsville, Md.

[73] Assignee: The United States of America as represented by the Secretary of the Navy, Washington, D.C.

[21] Appl. No.: 09/061,134

[22] Filed: Apr. 16, 1998

Related U.S. Application Data

[62] Division of application No. 08/430,955, Apr. 28, 1995, Pat. No. 5,776,861.

[51] Int. Cl.$^6$ ................................................. C04B 35/645
[52] U.S. Cl. .......................................... 505/491; 505/492
[58] Field of Search ..................................... 505/100, 120, 505/125, 432, 433, 491; 252/521.1

[56] References Cited

U.S. PATENT DOCUMENTS

| | | | |
|---|---|---|---|
| 5,120,704 | 6/1992 | Lechter et al. ................................ | 505/1 |
| 5,258,365 | 11/1993 | Sheng ........................................... | 505/1 |
| 5,300,482 | 4/1994 | Doi et al. ................................... | 505/120 |
| 5,332,721 | 7/1994 | Yin et al. ................................... | 505/492 |
| 5,444,039 | 8/1995 | Isawa et al. .............................. | 505/125 |

OTHER PUBLICATIONS

Lechter et al., *Physica C* 242 (1995) 221–227 No month.
Soulen et al., *Phys. Rev. B 51*, Jan. 1, 1995–II pp. 1393–1396.
Hoff et al., *Scanning* vol. 13, 265–272 (1991) 265–272 No month.
Hur et al., *Mat. Res. Bul.,* vol. 29, No. 9, pp. 959–964, 1994 No month.
Iqbal et al., *Phys. Rev. B,* vol. 49, No. 17, May 1, 1994 pp. 12322–12325.
Putilin et al., *Nature,* vol. 362, Mar. 18, 1993 pp. 226–228.
R.J. Cava, *Nature,* vol. 362, Mar. 18, 1993 pp. 204–228.
*Chemical and Engineering News,* Mar. 22, 1993 p. 18.
*Chemical and Engineering News,* May 10, 1993, p. 4.
C.W. Chu, "Superconductivity at Higher Temperatures in the Hg–Ba–Ca–Cu–O Compound System", 930809 Chu LT-20:90817, Aug. 18, 1993 pp. 1 through 8.
Schilling et al., *Physica C,* 216 (1993) 6–11) No month.
Xin et al., *J. Appl. Phys.,* 68(10), Nov. 15, 1990 pp. 5289–5292.
Osofsky et al., Abstract of Presentation made at the Materials Research Society 1994 Fall Meeting, Nov. 28 through Dec. 2, 1994, Boston Massachusetts.

*Primary Examiner*—Mark Kopec
*Attorney, Agent, or Firm*—Thomas E. McDonnell; Barry A. Edelberg

[57] ABSTRACT

Hg,Tl-based superconductors are produced by HIPping. A new superconducting phase, having a double (Hg,Tl)-layer and the nominal composition:

$$(Hg_{1-x}Tl_x)_2(Ba_{1-a}Sr_a)_2(Ca_{1-b}Y_b)_2Cu_3O_z$$

where $0 \leq x \leq 0.95$, $0 \leq a \leq 1$, $0 \leq b \leq 1$, and z is sufficient to provide said phase with a resistive and magnetic superconducting transition of 100 K or above, can be produced. Either precursor oxides, or partially or fully reacted mixed oxides, can be used in the HIPping mixture.

8 Claims, 1 Drawing Sheet ns and drawings 65
in which like numerals in different figures represent the same
structures or elements, wherein:

HIP METHOD OF MAKING HIGH TEMPERATURE MERCURY-CONTAINING SUPERCONDUCTORS

This application is a Division of Ser. No. 08/430,955 filed Apr. 28, 1995, now U.S. Pat. No. 5,776,861.

BACKGROUND OF THE INVENTION

1. Field of the Invention

The present invention relates generally to high temperature superconductors and more specifically to high temperature superconductors including mercury.

2. Description of the Background Art

The highest known superconducting transition temperature ($T_c$) at ambient pressure occurs in the system $HgBa_2Ca_{n-1}Cu_nO_y$. The next highest set of transition temperatures exists in the TlBaCaCuO layered cuprate family. For the former compounds, as many as four Cu—O layers have been made, but are accompanied by only one Hg—O layer in a unit cell. For the latter compounds, the maximum number of Cu—O layers is four, but both single and double Tl—O phases exist and they have higher transition temperatures. Attempts to increase $T_c$ in these compounds by doping have not succeeded: Substituting Sr for Ba significantly reduces $T_c$ in the Tl system and apparently has a similar effect in the Hg system. Recently, there was one report of a Hg/Tl intergrowth forming a unit cell wherein a 1201/Hg was combined with a 2201/Tl, with a $T_c$ about half that of either end member. Later, the synthesis of $Hg_{0.5}Tl_{0.5}Ba_2(Ca_{1.72}Sr_{0.28})Cu_3O$, with a single Hg/Tl layer and $T_c$ values of 128–132 K was reported. Also, a $(Hg,Tl)_2Ba_2CaCu_2O_y$ material with a $T_c$ of 100 K, and a $(Hg,Tl)Ba_2Ca_2Cu_3O_y$ were reported.

Hot isostatic pressing (HIPping) has been used to prepared superconducting sample that were difficult to prepare by other means. In addition to offering the element of safety, the use of a hot isostatic press (HIP) allows the operator to select a broader range of reaction temperatures and pressures than are normally accessible in conventional processing. Also, not only to the high pressures during the HIPping process contain the high Hg pressures during HIPping of Hg-containing precursors, but HIPping permits the formation of shields and test bars.

SUMMARY OF THE INVENTION

Accordingly, it is an object of the present invention to enhance the ease with which Hg and Tl-containing high temperature superconductors may be produced.

It is a further object of the present invention to provide novel superconducting materials having a double (Hg, Tl)—O layer structure.

These and other objects are achieved by HIPping a mixture of precursors for Hg and Tl-containing high temperature superconductors. Many of the materials produced by this HIPping process have a novel double (Hg,Tl)-layer structure. The process also allows for a wide choice in the selection of precursor compounds and metal cation ratios in the HIPping mixture.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
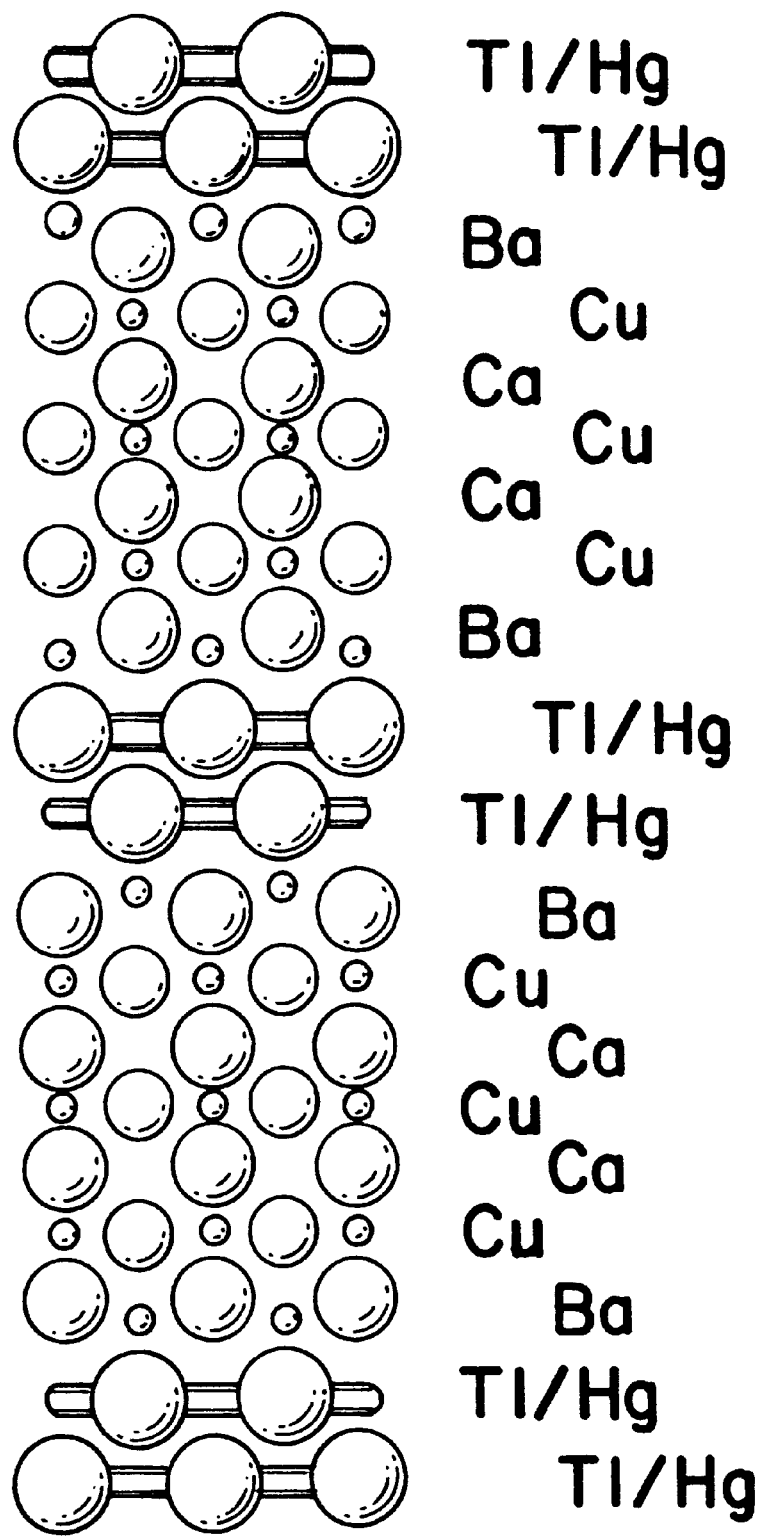
FIG. 1 is a computer simulated pattern showing the cation configuration of a new superconducting phase, made according to the present invention, having a double (Hg,Tl)-layer. In each layer, the small dots represent the oxygen atoms.

The starting materials for the present invention are precursor compounds containing copper, mercury (optionally substituted in part by thallium), barium and/or strontium, calcium and/or yttrium and oxygen. A major feature of the method of the present invention is the reduced significance of the processsng history on the nature and properties of the final product made. Thus, a wide, nearly endless variety of precursor compounds may be used according to the present invention.

Of course, precursor compounds typically used to provide superconductors may be used in the present invention. These typical compounds include carbonates, bicarbonates, oxides, nitrates, citrates. Thus, precursors such as copper (I, II or III) oxide, copper carbonate, copper bicarbonate, copper nitrate, copper citrate, mercury (I or II) oxide, thallium (I or III) oxide, barium oxide, barium carbonate, barium bicarbonate, barium nitrate, barium citrate, strontium oxide, strontium carbonate, strontium bicarbonate, strontium nitrate, strontium citrate, calcium oxide, calcium carbonate, calcium bicarbonate, calcium nitrate, calcium citrate, yttrium oxide, yttrium carbonate, yttrium bicarbonate, yttrium nitrate, and yttrium citrate, may be used to make superconducting materials according to the presently claimed invention.

Generally, all of the precursors are initially reacted to form a mixed (Ba,Sr)—(Ca,Y)—Cu oxide. The method used to react the initial precursors to form the mixed oxide, like the choice of the initial precursors, is not critical to attainment of the general objectives of the present invention. In all cases, it is important, however, to assure that the mixed oxide is essentially free of residues (such as carbon, nitrogenous compounds, water, etc.) from the precursors. Some unreacted oxide precursors, while undesirable, may remain in the mixed oxide if sufficient pressure is applied during later hipping to fully react the remaining oxide precursor.

Mercury (I or II) oxide, or a mixture of mercury (I or II) oxide and thallium (I or III oxide) is then added to the mixed oxide. Typically, precursors including mercury II or thallium III are used, and assist in providing oxygen for the desired superconducting phase.

Alternatively, the HIPping mixture may be a mixture of (Hg,Tl) oxide, (Ba,Sr) oxide, (Ca,Y) oxide and Cu oxide.

The HIPping mixture may also be or include a previously reacted, mixed (Hg,Tl)—(Ba,Sr)—(Ca,Y)—Cu oxide, superconducting or not. Here, the pressures applied while HIPping assist in more fully reacting the components of the mixed oxide and favor the formation of structure having a high $T_c$.

If precursors including mercury or thallium in lower than desired oxidation states are used, the as-produced hipped material may lack sufficient oxygen to form substantial amounts of the desired superconducting phase. In these circumstances, oxygenation of the hipped material, for example by heating in an oxygenating atmosphere at temperatures of about 400° C. to about 600° C., typically about 500° C., can provide a material having the optimum oxygen concentration.

Additionally, thallium (I) oxide provides less than an optimum amount of oxygen for formation of the desired superconducting phase, while thallium (III) oxide includes more than the ideal amount of oxygen for formation of the desired superconducting phase. Mixtures of mercury oxide and thallium oxide that are rich in thallium (III) oxide may thus require post-hipping reduction in a reducing atmosphere, such as Ar, vacuum, H or a mixture of Ar and H to provide the optimal oxygen concentration. Additionally, within the limits of the compositional ranges disclosed in the present specification, the ratios of mercury (I) oxide, mercury (II) oxide, thallium (I) oxide, and thallium (III) oxide may be adjusted to provide the hipped material with the optimum amount of oxygen for formation of the desired superconducting phase without the need for a post-hipping oxygenation or reduction.

The mercury oxide or mixture of mercury and thallium oxide are intimately mixed with the mixed (Ba,Sr)—(Ca,Y)—Cu oxide. This mixture of mercury oxide or mercury/thallium oxide and (Ba,Sr)—(Ca,Y)—Cu oxide is then wrapped in gold foil, platinum foil, soft glass (such as Pyrex™, a borosilicate glass), or other compressible enclosure of a material that does not, at the hipping pressures and temperatures used, migrate sufficiently into the precursor materials to prevent the formation of the desired superconducting phase. This hermetic wrapping seals the hipping material. While undesirable, it is both common and permissible for some components of the precursor materials, particularly mercury and thallium, to migrate into the enclosing material during hipping. In these cases, the amount of precursor material component, such as mercury or thallium, that migrates into the enclosing material during hipping may be compensated for by including, in the mixture of precursor materials, additional amounts of the precursor containing the migrating component prior to hipping. If the HIPping mixture is hermetically sealed in a foil, such as gold foil or platinum foil, the foil is then typically hermetically sealed within a stainless steel envelope. If the HIPping mixture is to be hermetically sealed in a soft glass container, it is preferable to first pre-heat the HIPping mixture in the soft glass container to a temperature from about 700° C. to about 800° C. at a pressure of at least about 100 psi for from about 20 minutes to about 40 minutes. This is because, unlike stainless steel, soft glasses such as Pyrex™ take longer to melt and surround the HIPping mixture. The mechanics of hermetically sealing are also explained in U.S. Pat. No. 5,120,704, to Lechter et al., the entirety of which is incorporated by reference herein for all purposes.

After the hermetically sealed HIPping mixture is sealed within in a hipping chamber. Typically, the hipping is then moderately pressurized (for example, about 600 psi) and the sample checked for leaks. Once the sample passes the leak test, the pressure within the chamber is raised to a pressure sufficient to overcome the vapor pressure of the mercury and thallium at the selected hipping temperature. Typically, useful starting pressures for hipping extend from about 2000 psi to about 10,000 psi (depending upon the mechanics of the HIP. In some cases, the mechanics of a commercially-available HIP may require a certain minimum pressure before the HIP can be heated without damage to the HIP. The maximum starting pressure in the HIP furnace should be selected to avoid exceeding the limits of the HIP at the hipping temperature selected.

Once the HIP has been appropriately pressurized, HIP furnace is heated to the temperature needed to reacting the HIPping mixture. The desired temperature typically extends from about 800° C. to a temperature just below the melting temperature of either the reaction mixture of the sealing materials. More typically, this temperature extends from about 850 to about 975° C. More often, the hipping temperature extends from about 860 to about 950. Most often, the hipping temperature extends from about 860 to about 900. Lower than optimal hipping temperatures may result in incomplete reaction of the HIPping mixture, thus lowering the concentration of the desired high temperature superconducting phase in the final product. Within these ranges, the hipping temperatures may be varied over the course of hipping. Higher than optimal hipping temperatures may melt the HIPping mixture and reduce the concentration of the desired high temperature superconducting phase in the final product.

After the HIP furnace has reached the desired temperature, the pressure is typically adjusted to meet the desired processing pressures. The pressure at hipping temperatures may extend from about 2 ksi to the mechanical limits of the HIP. Typically, these pressures range from about 2 ksi to about 30 ksi. Higher HIPping pressure promote the formation of a denser product.

Typically, the HIPping mixture is maintained under these conditions of temperature and pressure for from about 5 minutes to about 8 hours. More often, the HIPping mixture is maintained under these conditions for from about 20 minutes to about 80 minutes. Most often, the HIPping mixture is maintained under these conditions for about 20 minutes to about 60 minutes. Less than optimal hipping times may incompletely react the HIPping mixture and reduce the concentration of the high temperature superconducting phase in the final product. Longer than optimal hipping times may increase the formation of undesired phases and thus also reduce the concentration of the desired high temperature superconducting phase in the final product.

To assure that the sample made according to the present invention has significant superconductivity, the metal cation ratios should be sufficient to form a consolidated superconducting bulk material having a magnetic superconducting transition and R=0 at a temperature of 90 K or above (typically 100 K or above), at least 10 volume percent of said bulk material being a phase having the nominal composition:

$$(Hg_{1-x}Tl_x)_u(Ba_{1-a}Sr_a)_2(Ca_{1-b}Y_b)_yCu_wO_z$$

where $0 \leq x \leq 0.9$, $0 \leq a \leq 1$, $0 \leq b \leq 1$, u is 1 or 2, y is 1 or 2, w is 2 or 3, and z is sufficient to provide said phase with a resistive and magnetic superconducting transition of 90 K or above (typically 100 K or above). Typically, $6 \leq z \leq 10$. A wide variety of metal cation ratios in the HIPping mixture will meet this requirement, since the hipping procedure favors the formation of the desired superconducting material, decreasing the significance of the ratio of the metal cations within the HIPping mixture. The purity of the material will be determined by the closeness of the cation ratio in HIPping mixture to the nominal composition provided above. If the cation ratio in the HIPping mixture is within the ranges given in the above nominal composition, an essentially single phase (at least 90 volume percent pure as determined by x-ray diffraction) can be obtained.

Most of the samples made according to the present invention where found to contain significant (at least about 10 volume percent) amount of a new phase having a double (Hg,Tl)—O layer and the nominal composition:

$$(Hg_{1-x}Tl_x)_2(Ba_{1-a}Sr_a)_2(Ca_{1-b}Y_b)_2Cu_3O_z$$

where $0 \leq x \leq 0.95$, $0 \leq a \leq 1$, $0 \leq b \leq 1$, and z is sufficient to provide the phase with a resistive and magnetic superconducting transition of 90 K or above, typically 100 K or above. Again, $6 \leq z \leq 10$. Also, the closer the cation ratios in the HIPping mixture being hipped, the greater the purity of the final hipped product. Hipping, according to the present invention, a mixture having the formula provided for the double-layer superconductor, can provide an essentially single phase superconducting material.

FIG. 1 shows the cation configuration of a double-layer superconducting phase according to the present invention. This structure is similar to the double layer Tl-2223 structure. Based on the great similarity between T; and Hg, it is reasonable to believe that the Hg partially substitutes for the Tl in the double Tl—O layer of the Tl-2223 structure.

The present invention can provide a great variety of superconducting structures. For example, superconducting tubes and plates, etc., can be readily made according to the present invention.

Having described the invention, the following examples are given to illustrate specific applications of the invention including the best mode now known to perform the invention. These specific examples are not intended to limit the scope of the invention described in this application.

EXAMPLES

Precursors of the Ba, Sr, Ca and Cu oxides were prepared from $BaCO_3$, $CaCO_3$ and CuO by alternate calcination at 900° C. in air for 16 h and grinding of the products in a mortar and pestle. After two or three cycles, the precursors were then mixed in a mortar and pestle with HgO and $Tl_2O_3$. These mixed powders were placed in a pouch of gold foil, which was then sealed inside a thin-walled stainless steel container under vacuum. Boron nitride was used as a release agent between the gold and stainless steel. After leak checking the containers, the enclosed samples were placed in the HIP chamber. The system was purged and then pressurized to about 15 MPa with argon gas, then heat to and held 300° C. for about 30 min. The gas pressure was then increased to about 50 MPa and the temperature was increased to 850° C. During heating, the pressure in the chamber increased to about 110 MPa. Using a piston-type compressor, the chamber was then pressurized to 160 MPa. The sample was held under these conditions for about 30 min after which time the power to the furnace was shut off. When the furnace cooled to about 300° C., the remaining gas pressure was released. The complete shut-down cycle lasted about 15 min. In an alternate procedure, which produced denser samples, the chamber was pressurized at room temperature to 15 MPa and the sample was then heated to 900° C. while the pressure was increased to 210 MPa. After holding the sample under these conditions for about 3 h, the sample was cooled following the procedure described above.

After processing and removal from the stainless steel container, the gold foil was peeled off the sample. No evidence for a reaction between the stainless steel and gold, or between the gold and the sample, was found. These compounds were also successfully synthesized at much higher pressures (~6 GPa) and at higher temperatures in a tetrahedral press. A sample having the $HgTlBa_4Ca_4Cu_6O_x$, which had a 2223 phase as the predominant structure, exhibited $T_{onset}=126$ K and $T_0=119$ K. The analysis and results from these sample are discussed fully in Lechter et al., *Physica C.*, 242 (2995) 221–227, the entirety of which is incorporated herein by reference for all purposes. Further structural analysis of the materials according to the present invention is provided in Peng et al., Structural Analysis of Tl/Hg-Based Superconductor with Nominal Composition $Tl_2Hg_1Ba_4Ca_4Cu_6O_x$ Having $T_c=120$ K, to be presented at the Microscopy Society of America 53rd Annual Meeting, Aug. 13–17, 1995, Kansas City, Mo., the entirety of which is incorporated herein by reference for all purposes.

Obviously, many modifications and variations of the present invention are possible in light of the above teachings. It is therefore to be understood that, within the scope of the appended claims, the invention may be practiced otherwise than as specifically described.

What is claimed is:

1. A method of forming an essentially single phase bulk superconducting material, comprising the steps of:

hot isostatically pressing a starting material comprising a mixed (Hg,Tl)—(Ba,Sr)—(Ca,Y)—Cu oxide; a mixture of (Hg,Tl) oxide, (Ba,Sr) oxide, (Ca,Y) oxide and Cu oxide; or a mixture of (Hg,Tl) oxide with a mixed (Ba,Sr)—(Ca,Y)—Cu oxide so as to form a consolidated superconducting bulk material having a magnetic superconducting transition and R=0 at a temperature of 100 K or above, said bulk material being a phase having the nominal composition:

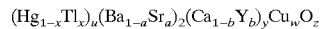

$(Hg_{1-x}Tl_x)_u(Ba_{1-a}Sr_a)_2(Ca_{1-b}Y_b)_yCu_wO_z$ where $0 \leq x \leq 0.9$, $0 \leq a \leq 1$, $0 \leq b \leq 1$, u is 1 or 2, y is 1 or 2, w is 2 or 3, and z is sufficient to provide said phase with a resistive and magnetic superconducting transisition of 100 K or above.

2. The method of claim 1, wherein $6 \leq z \leq 10$.

3. The method claim 1, wherein said (Hg,Tl) oxide, (Ba,Sr) oxide, (Ca,Y) oxide and Cu oxide in said starting material are present in stoichiometric amounts so as to form, upon completion of said step of hot isostatic pressing step, an essentially single phase superconducting bulk material of said nominal composition.

4. The method of claim 1, wherein said starting material is enclosed within an Au metal container during said step of hot isostatic pressing.

5. The method of claim 1, wherein u is 2.

6. The method of claim 1, wherein said starting material comprises a mixture of (Hg,Tl) oxide, (Ba,Sr) oxide, (Ca,Y) oxide and Cu oxide.

7. The method of claim 1, wherein said starting material comprises a mixture of (Hg,Tl) oxide with a mixed (Ba, Sr)—(Ca,Y)—Cu oxide.

8. The method of claim 1, wherein said starting material comprises a mixed (Hg,Tl)—(Ba,Sr)—(Ca,Y)—Cu oxide.

* * * * *